United States Patent
Maioli (10) Patent No.: US 11,500,034 B2
(45) Date of Patent: Nov. 15, 2022

(54) ELECTRICAL CABLE STRUCTURE ANALYSIS METHOD AND APPARATUS

(71) Applicant: Prysmian S.p.A., Milan (IT)

(72) Inventor: Paolo Maioli, Milan (IT)

(73) Assignee: Prysmian S.p.A., Milan (IT)

( * ) Notice: Subject to any disclaimer, the term of this patent is extended or adjusted under 35 U.S.C. 154(b) by 0 days.

(21) Appl. No.: 17/068,083

(22) Filed: Oct. 12, 2020

(65) Prior Publication Data

US 2021/0116516 A1 Apr. 22, 2021

(30) Foreign Application Priority Data

Oct. 18, 2019 (IT) .................. 102019000019262

(51) Int. Cl.
 *G01R 31/58* (2020.01)
 *G01R 15/20* (2006.01)
(52) U.S. Cl.
 CPC ............. *G01R 31/58* (2020.01); *G01R 15/20* (2013.01)
(58) Field of Classification Search
 CPC ................................ G01R 31/58; G01R 15/20
 See application file for complete search history.

(56) References Cited

U.S. PATENT DOCUMENTS

| | | |
|---|---|---|
| 2012/0306510 A1 | 12/2012 | White et al. |
| 2014/0266178 A1 | 9/2014 | Ausserlechner |
| 2015/0000954 A1 | 1/2015 | Nonen et al. |
| 2015/0128706 A1* | 5/2015 | Godfrey ................. G01H 9/004 |
| | | 73/574 |
| 2015/0170795 A1 | 6/2015 | Maioli et al. |
| 2015/0301088 A1 | 10/2015 | Soneda et al. |
| 2017/0102415 A1 | 4/2017 | Sarchi et al. |
| 2018/0045768 A1* | 2/2018 | Godfrey ............... G01R 31/086 |
| 2018/0180658 A1 | 6/2018 | Godfrey |

FOREIGN PATENT DOCUMENTS

| | | |
|---|---|---|
| CN | 108828289 A | 11/2018 |
| DE | 102011076933 A1 | 12/2011 |
| JP | 3284236 B2 | 5/2002 |
| JP | 2017142084 A | 8/2017 |
| WO | WO-9722012 A1 * | 6/1997 ............ G01R 1/071 |
| WO | 2018111115 A1 | 6/2018 |

OTHER PUBLICATIONS

Nexans Norway AS, "Integration of Fiberoptic Element in Armoured Three Core Submarine Cables," 2017, 4 pages.

Dell'Anna et al., The Electric Power System of the Future: Integrating Supergrids and Microgrids, CIGRE Symposium, "HV submarine cables for renewable offshore energy," 2011; 7 pages.

* cited by examiner

*Primary Examiner* — Feba Pothen
(74) *Attorney, Agent, or Firm* — Slater Matsil, LLP (57) ABSTRACT

An electrical cable analysis method includes providing an electrical cable comprising an elongated metallic element and a cable core, the cable core comprising an electrical conductor. The method includes connecting an electrical generator to an electrical circuit including the elongated metallic element, generating, by the electrical generator, a flow of an electrical current along the electrical circuit, detecting a magnetic field associated with the flow of the electrical current in the electrical cable, measuring at least one value relating to the magnetic field along a cable length of the electrical cable, and analyzing the measured at least one value to obtain information about at least one structural aspect of the electrical cable.

15 Claims, 7 Drawing Sheets

ELECTRICAL CABLE STRUCTURE ANALYSIS METHOD AND APPARATUS

CROSS-REFERENCE TO RELATED APPLICATIONS

This application claims the benefit of Italian Patent Application No. 102019000019262 filed on Oct. 18, 2019, which application is hereby incorporated herein by reference.

TECHNICAL FIELD

The present disclosure relates to method and apparatus for analyzing electrical cables structures.

BACKGROUND

Electrical cables are generally manufactured by stranding the core/cores. Each cable core comprises an electrical conductor in the form of a rod or of stranded wires, and an insulating system (comprising an inner semiconductive layer, an insulating layer and an outer semiconductive layer), which can be individually screened by a metal screen.

Often, electrical cables comprise an optical fiber cable, as a temperature sensor or for telecommunication purpose. In the optical fiber cable, the optical fiber can be housed in metal (steel) tube for protection purposes.

Dell'Anna et al., The Electric Power System of the Future: Integrating Supergrids and Microgrids, CIGRE Symposium, 2011; 1-7 discloses a three-core cable including an optical fiber cable stranded with the cores.

Due to problems occurred during manufacturing or deployment, the electrical cables can show anomalies with respect to their design. As an example, the metal tube containing the optical fibers can be displaced in an improper position, where unexpected pressure is exerted on the tube and damage/rupture of the optical fiber can occur. Other anomalies may relate to the parameters defining the stranding of the cores or the winding of the armor. The anomalies may be of such a magnitude that the cable is unusable.

Such unfortunate events can be discovered by testing the optical fiber operation. For example, document "Integration of Fiber Optic Element in Armored Three Core Submarine Cables", 2017 (Nexans Norway) addresses potential failure modes of the integrated FOC (Fiber Optic Cable) element in three-core submarine export cables. According to this document, during lay-up at cable factory, continuous monitoring of the optical signal may be utilized, detecting if high strain occurs somewhere along the FOC in the production line.

SUMMARY

In an embodiment, an electrical cable analysis method includes providing an electrical cable comprising an elongated metallic element and a cable core, the cable core comprising an electrical conductor. The method includes connecting an electrical generator to an electrical circuit including the elongated metallic element, generating, by the electrical generator, a flow of an electrical current along the electrical circuit, detecting a magnetic field associated with the flow of the electrical current in the electrical cable, measuring at least one value relating to the magnetic field along a cable length of the electrical cable, and analyzing the measured at least one value to obtain information about at least one structural aspect of the electrical cable.

In an embodiment, an electrical cable analysis system comprises an electrical generator connectable to an electrical circuit including an elongated metallic element integrated into an electrical cable; the electrical generator being configured to generate an electrical current flowing into the elongated metallic element. The system includes a detection apparatus configured to detect a magnetic field associated with the electrical cable from the generated electrical current to provide at least one measured value; and an analyzing device configured to process the at least one measured value to obtain information about at least one structural aspect of the electrical cable.

In an embodiment, a detection apparatus comprises a support structure configured to support a plurality of magnetic field probes, the support structure comprising a support frame including an internal hollow region for holding an electrical cable during a magnetic measurement operation. The apparatus includes a support leg to allow a vertical regulation of the distance of support frame from a ground plane, an opening/closure and a hinge provided in the support frame to open and close the support frame for introduction of the cable, and a plurality of fixing devices disposed in the support structure configured to arrange the magnetic field probes to the support frame.

BRIEF DESCRIPTION OF THE DRAWINGS

Further characteristics and advantages will be more apparent from the following description of a preferred embodiment and of its alternatives given as a way of an example with reference to the enclosed drawings in which.

DETAILED DESCRIPTION OF ILLUSTRATIVE EMBODIMENTS

The Applicant observed that the methods commonly used for detecting optical fiber rupture or attenuation can provide information about up to two damaged points only. In addition, the optical fiber can result undamaged, but if a misplacement of the position of the metal tube occurred, this could harm the fiber after deployment, during cable operation. As a fact, the testing of the optical fiber performance does not give info about a possible misplacement of the metal tube, such info being potentially useful to ascertain possible deficiencies in the manufacturing (metal tube winding) process or in the subsequent operations.

An analysis method allowing obtaining information about the cable structure and not limited to the detection of failures of the optical fiber cable would satisfy a need felt both by cable manufactures and cable utilizers.

The Applicant has found that measuring a magnetic field generated by a current injected in an elongated metallic element integrated in an electrical cable allows efficiently deriving information about the structure of the electrical cable itself.

According to a first aspect, the present disclosure relates to an electrical cable analysis method comprising: providing an electrical cable comprising an elongated metallic element and a cable core, the latter comprising an electrical conductor; connecting an electrical generator to an electrical circuit including said elongated metallic element; generating by the electrical generator an electrical current flowing along the electrical circuit; detecting a magnetic field associated to the electrical cable and the electrical current; measuring at least one value relating to the magnetic field along the cable length; and analyzing the measured at least one value to obtain information about at least one structural aspect of the electrical cable.

In an embodiment, the electrical cable comprises two or more cable cores, for example three, helically stranded around a cable longitudinal axis, each comprising an electrical conductor.

In an embodiment, the elongated metallic element can be a metallic tube comprised in an optical fiber cable and/or a metallic conductor of a ground conductor.

In an embodiment, the elongated metallic element can be stranded with the cable core/s around a longitudinal cable axis or can be rectilinearly positioned along or near the longitudinal cable axis. When the elongated metallic element is rectilinearly positioned, the electrical cable comprises two or more cable cores stranded about it.

In an embodiment: the elongated metallic element has a first end and a second end; and forming an electrical circuit comprises: selecting at least one electrical conductor having a first connection end and a second connection end; connecting the electrical circuit to an electrical generator comprises: connecting the second end of the metallic tube to the second connection end of the electrical conductor; and connecting the first end of the elongated metallic tube to a first terminal of the electrical generator and the first connection end of the electrical conductor to a second terminal of the electrical generator.

In an embodiment, the electrical conductor connecting the electrical generator and the second end of the elongated metallic element can be one or more electrical conductor comprised in a cable, like a cable core or a ground conductor (when the latter is not involved in the analysis), or an electrical conductor external to (not integrated into) the electric cable.

In an embodiment, the electrical current of the generating step is can be an alternate current (AC) or a direct current (DC).

In an embodiment, the magnetic field of the detecting step is a tangential magnetic field.

In an embodiment, the magnetic field of the detecting step is external to the electrical cable.

In an embodiment, the magnetic field associated to the electrical depends on a distance between the elongated metallic element and the electrical conductor/s connected thereto in the electrical circuit.

In an embodiment, the measuring step comprises reading a plurality of values relating to the magnetic field along the cable length.

In an embodiment, the step of analyzing the measured value(s) can provide information about a structural aspect of the electrical cable like: a position of the elongated metallic element within the electrical cable; a stranding/winding parameter of a cable element.

In an embodiment, the stranding/winding parameter is selected from: stranding core pitch, cable pitch; longitudinal position of inversion zone; longitudinal position of cable contralay/equilay zone, as in the SZ-lay configuration.

In an embodiment, analyzing the measured at least one value to obtain information about a structural aspect of the electrical cable comprises at least one of the following steps: analyzing peak values(s) of the magnetic field associated to the electrical cable; analyzing angular positions of the peak values(s) with respect to a circumference surrounding the electrical cable.

In an embodiment, measuring values related to the magnetic field associated to the electrical cable comprises: measuring a first plurality of magnetic field values each associated with a respective first angular peak position on a first reference circumference surrounding the electrical cable; the first reference circumference being positioned at first longitudinal position along the electrical cable; selecting among the first plurality of magnetic field values a first peak value and the corresponding first angular peak position at a given length; measuring at least one further plurality of magnetic field values associated with at least one respective further angular position on at least one further reference circumference surrounding the electrical cable; the at least one further reference circumference being positioned at at least one further longitudinal position along the electrical cable; and selecting among the further plurality of magnetic field values at least one further peak value and at least one respective further angular peak position.

In an embodiment, analyzing the measured at least one value comprises analyzing at least one of the following trends to obtain information about at least one structural aspect of the electrical cable: a first trend related to the first peak value associated with the first longitudinal position and the at least one further peak value associated with the at least one further longitudinal position; a further trend related to the first angular peak position associated with the first longitudinal position and the at least one further angular peak position associated with the at least one further longitudinal position.

As an example, the method of the present disclosure can be performed during manufacturing of the cable and/or on a manufactured cable.

According to a second aspect, the present disclosure relates to an electrical cable analysis system, comprising: an electrical generator connectable to an electrical circuit including an elongated metallic element integrated into the electrical cable; the electrical generator being configured to generate an electrical current flowing into said elongated metallic element; a detection apparatus configured to detect a magnetic field associated to the electrical cable and to the generated electrical current to provide at least one measured value; an analyzing device configured to process the at least one measured value to obtain information about at least one structural aspect of the electrical cable.

In an embodiment, information about a structural aspect of the electrical cable can be: a position of the integrated elongated metallic element within the electrical cable; a stranding/winding parameter of a cable element.

In an embodiment, the stranding/winding parameter is selected from: a stranding core pitch, a cable pitch; longitudinal position of inversion zone; longitudinal position of cable contralay/equilay zone.

In an embodiment, the detection apparatus comprises one or more magnetic field probes configured to provide electrical signals corresponding to the magnetic field.

For the purpose of the present description and of the appended claims, except where otherwise indicated, all numbers expressing amounts, quantities, percentages, and so forth, are to be understood as being modified in all instances by the term "about". Also, all ranges include any combination of the maximum and minimum points disclosed and include any intermediate ranges therein, which may or may not be specifically enumerated herein.

The present disclosure, in at least one of the aforementioned aspects, can be implemented according to one or more of the following embodiments, optionally combined together.

For the purpose of the present description and of the appended claims, the words "a" or "an" should be read to include one or at least one and the singular also includes the plural unless it is obvious that it is meant otherwise. This is done merely for convenience and to give a general sense of the disclosure.

In the present description, as "SZ-lay" it is meant a reverse oscillating lay configuration of a cable element where right-handed and left-handed lay-up direction are alternated. Cable elements possibly laid with an SZ-lay are the cable core/s together with an optical fiber cable and/or ground conductors.

In the present description and claims, as "cable core" it is meant a cable element comprising an electrical conductor surrounded by an insulating system comprising, in turn, an insulating layer and, optionally, one or two semiconductive layer provided in radially inner and/or outer position with respect to and in direct contact with the insulating layer (e.g. inner semiconductive layer and outer semiconductive layer). The cable core can also comprise an electric screen layer surrounding the insulating system.

Figure 1:
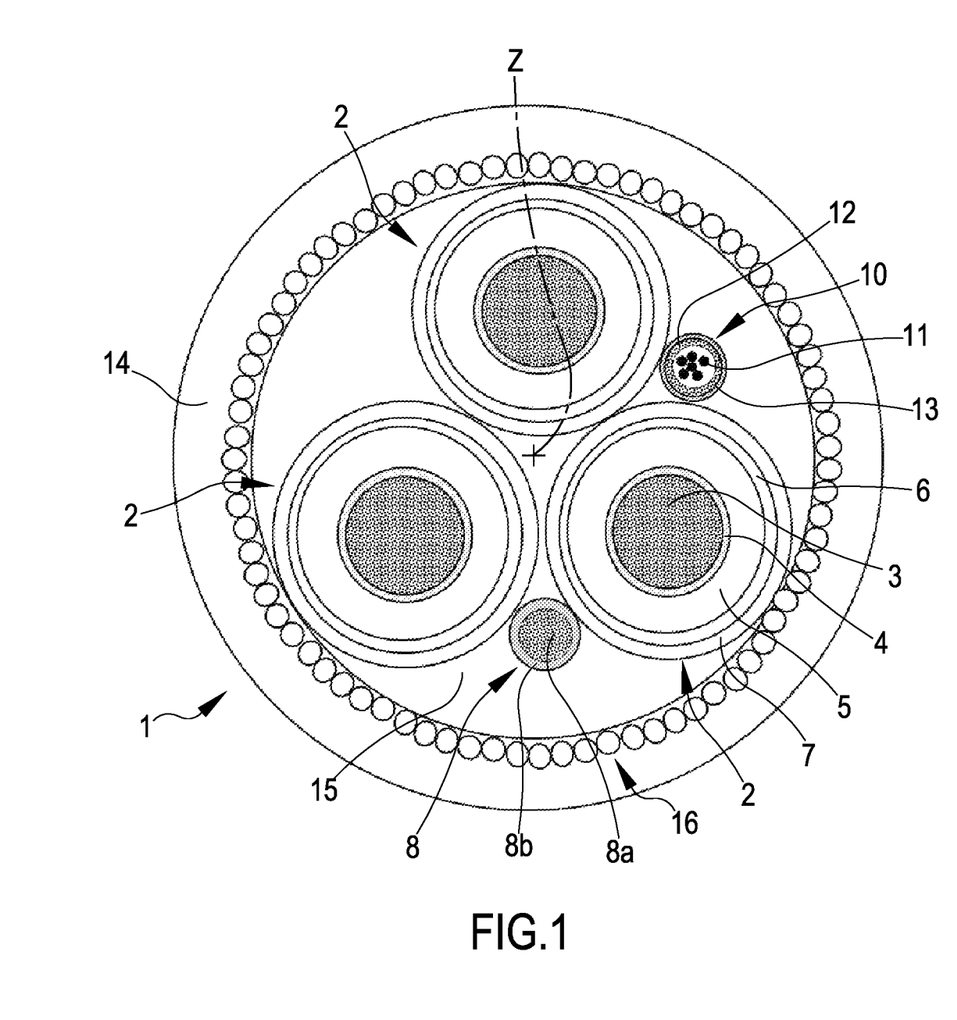
FIG. 1 shows a cross-sectional view of an embodiment of an electrical cable including an elongated metallic element (an optical fiber cable) in a proper position.

FIG. 1 illustrates a cross-sectional view of an embodiment of an electrical cable 1. Particularly, the electrical cable 1 (hereinafter, also referred to as "cable") is a three-core cable comprising three cable cores 2 (hereinafter also referred to as "core") radially arranged about a central longitudinal axis Z of the cable 1. According to other embodiments, the electrical cable can be a single-phase cable or another type of multiphase cable.

Cable 1 can be a medium or high voltage electrical cable, where medium voltage indicates a voltage of from 1 kV to 30 kV and high voltage indicates a voltage greater than 30 kV. Each core 2 comprises an electrical conductor 3, for example, a copper conductor formed by a bundle of enamelled or bare copper electrical wires stranded together according to conventional methods.

As an example, in radial external position with respect to each electrical conductor 3, an inner semi-conductive layer 4, an insulating layer 5, an outer semi-conductive layer 6 are sequentially provided. Inner semi-conductive layer 4, insulating layer 5 and outer semi-conductive layer 6 are made, as an example, of polymeric-based materials that can be extruded one around the other or co-extruded onto the conductor 3. The insulating layer 5 can be, for example, of cross-linked ethylene propylene rubber (EPR); the inner and outer semi-conductive layers 3 and 6 can be, for example, of EPR, ethylene/propylene/diene terpolymers (EPDM) or a mixture thereof, charged with a suitable amount of a conductive filler, which can be typically carbon black.

Alternatively, both the insulating layer and semi conductive layers of the cable core can be made of thermoplastic compounds, such as polypropylene based compounds.

In some applications, the cable core 2 comprises at least one electric screen 7 in a radially external position with respect to and in direct contact with the outer semi-conductive layer 6. The electrical screen 7 can comprise an inner metallic layer (e.g. a copper braid or wires or foil layer) surrounded by a polymeric semiconductive layer.

According to an example, cable 1 can optionally comprise at least one ground conductor 8. In the embodiment shown in FIG. 1 the ground conductor 8 comprises a metallic conductor 8a, for example, in form of a bundle of stranded enameled or bare copper electrical wires surrounded by a ground semiconductive layer 8b. The ground conductor 8 is stranded together with the cores 2 along the cable longitudinal direction Z.

Interstitial areas 15 can be filled with polymeric filler in form threads or extruded. Alternatively, in each interstitial area 15, a shaped filler in polymeric material can be provided.

An outer jacket 14 is provided, for example by extrusion. To increase the resistance of the electrical cable to mechanical stresses, the outer jacket 14 is generally made of a cured polymeric material, preferably based on a reinforced heavy-duty thermosetting elastomer, such as high density polyethylene (HDPE), polychloroprene, polyurethane or BR-based compound. An armoring 16 in form, for example, of helically wound metal or polyester wires, can be provided within the outer jacket 14.

An optical fiber cable 10 is integrated in the cable 1. The optical fiber cable 10 comprises one or more optical fibers ii (e.g., for transmission of control signals, communication, and other data signals) housed in a metallic tube 12. The metallic tube 12 can house a filling compound surrounding the optical fibers ii. The metallic tube 12 has protective function and, as an example, is a stainless steel tube. In the present embodiment, the metallic tube 12 is surrounded by a semi-conductive sheath 13. In the cable 1 of FIG. 1, the optical fiber cable 10 is stranded together with the cores 2.

In FIG. 1, the optical fiber cable 10 is placed in a correct position according to which, considering the cross-sectional view of the cable 1, the optical fiber cable 10 is in an interstitial areas 15 between two cores 2.

According to a known manufacturing technique, cable 1 is manufactured by stranding (e.g. helically stranding) the cores 2, the optical fiber cable 10 and the earth conductors 8 around the central longitudinal axis Z. Also the armoring 16 can be submitted in helical winding with respect to the central longitudinal axis Z.

The winding of the cable elements can be performed according to different known configurations. As an example, the three cores 2, the optical fiber cable 10 and the ground conductor 8 can be helically wound according to a right rotation direction (i.e. clockwise direction) or a left rotation direction (i.e. counter-clockwise direction), with a constant core stranding pitch.

According to an embodiment, the three cores 2, the optical fiber cable 10 and the ground conductor 8 can be helically wound according to an SZ-lay comprising longitudinal portions wound according to a right rotation direction (having a length of one or more core stranding pitches) and other longitudinal portions made according to a left rotation direction (having a length of one or more core stranding pitches). In a cable having the above described core SZ-laying, an inversion stranding direction occurs in the so-called "inversion zone".

The armoring 16 of cable 1 can be helically wound with an armoring winding pitch equal or different from the core stranding pitch of the cores 2. The armoring 16 can be wound according to the same rotation direction of the three cores 2 or with an opposite rotation direction. A cable or cable portion wherein the armoring 16 has the same rotation direction of the helically stranded cores is referred to as "equilay" cable/cable portion. A cable or cable portion wherein the armoring 16 follows a rotation direction opposite to the rotation direction of the helically stranded core or cores 2 is referred to as "contralay" cable/cable portion. In a SZ cables, contralay portions are interleaved with unilay portions.

Figure 2:
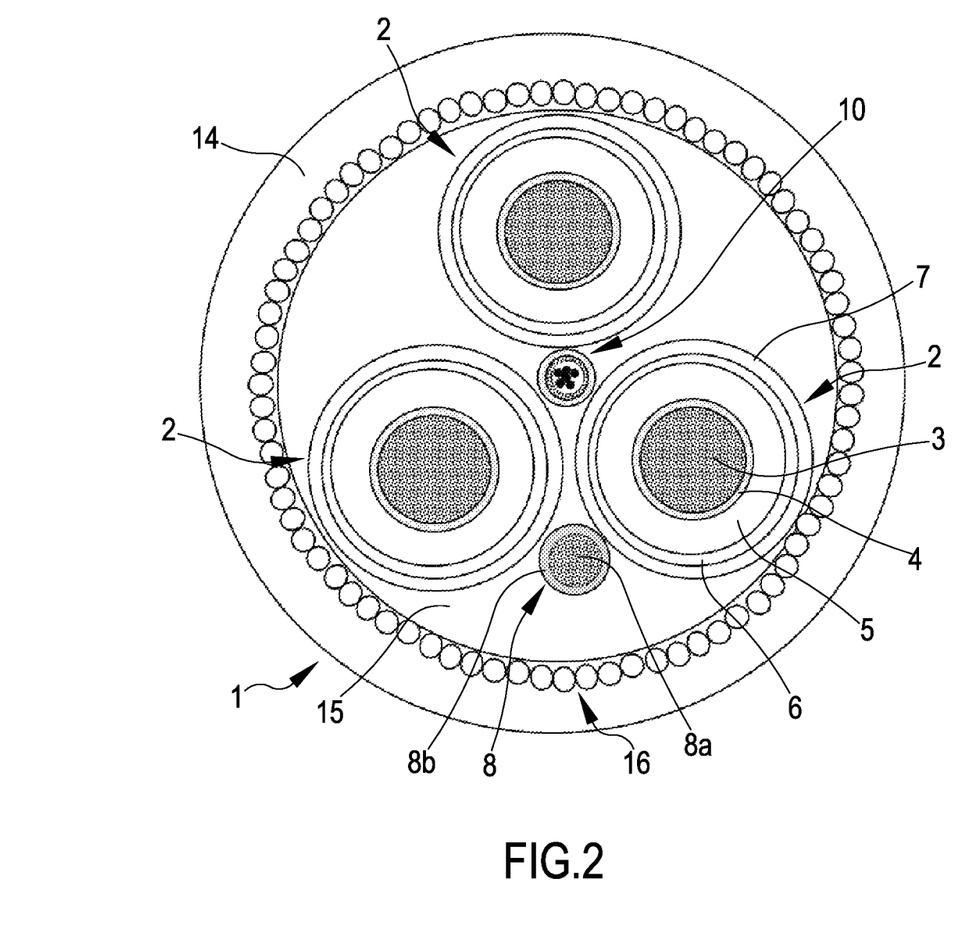
FIG. 2 shows a cross-sectional view of an exemplary electrical cable analogous to that of FIG. 1 and including an elongated metallic element (an optical fiber cable) in an improper position.

It is noticed that during manufacturing or deployment of an electrical cable, such as cable 1, optical fiber cable 10 and or ground conductor 8 can be displaced in an improper position. FIG. 2 illustrates, as an example, a longitudinal section of the cable 1 where an optical fiber cable 10 is in an improper position, in this case in the center of the cable 1. Being the electrical cable 1 designed to have the optical fiber cable 10 wound together with its cable core 2, as in FIG. 1, the positioning of the optical fiber cable 10 in the center of the cable 1 as in the cross-section of FIG. 2 means that something went well wrong and that the optical fiber cable 10 is squeezed between to cable core 2 in other cable longitudinal section. The optical fiber cable 10 could assume further improper positions such as an example, intermediate radial positions between those shown in FIG. 1 and FIG. 2.

It is observed that when optical the fiber cable 10 or a length thereof is in an improper position damage/rupture of the optical fiber cable 10 can occur if, for example, unexpected pressure or strain is exerted on the metallic tube 12. As already said above, the damage/rupture of an optical fiber can be discovered by testing the optical fiber operation, but the methods commonly used for detecting optical fiber rupture or attenuation can provide information about up to two damaged points, only. Furthermore, even if the optical fiber cable 10 can result undamaged, the misposition of the metallic tube 12 could harm the fiber after deployment, during cable operation.

Moreover, it is possible that cable 1 has other structural anomalies, i.e. shows structural aspects not corresponding to the designed ones, like an improper number of rotations between two inversion zones in a SZ-lay.

Figure 3:
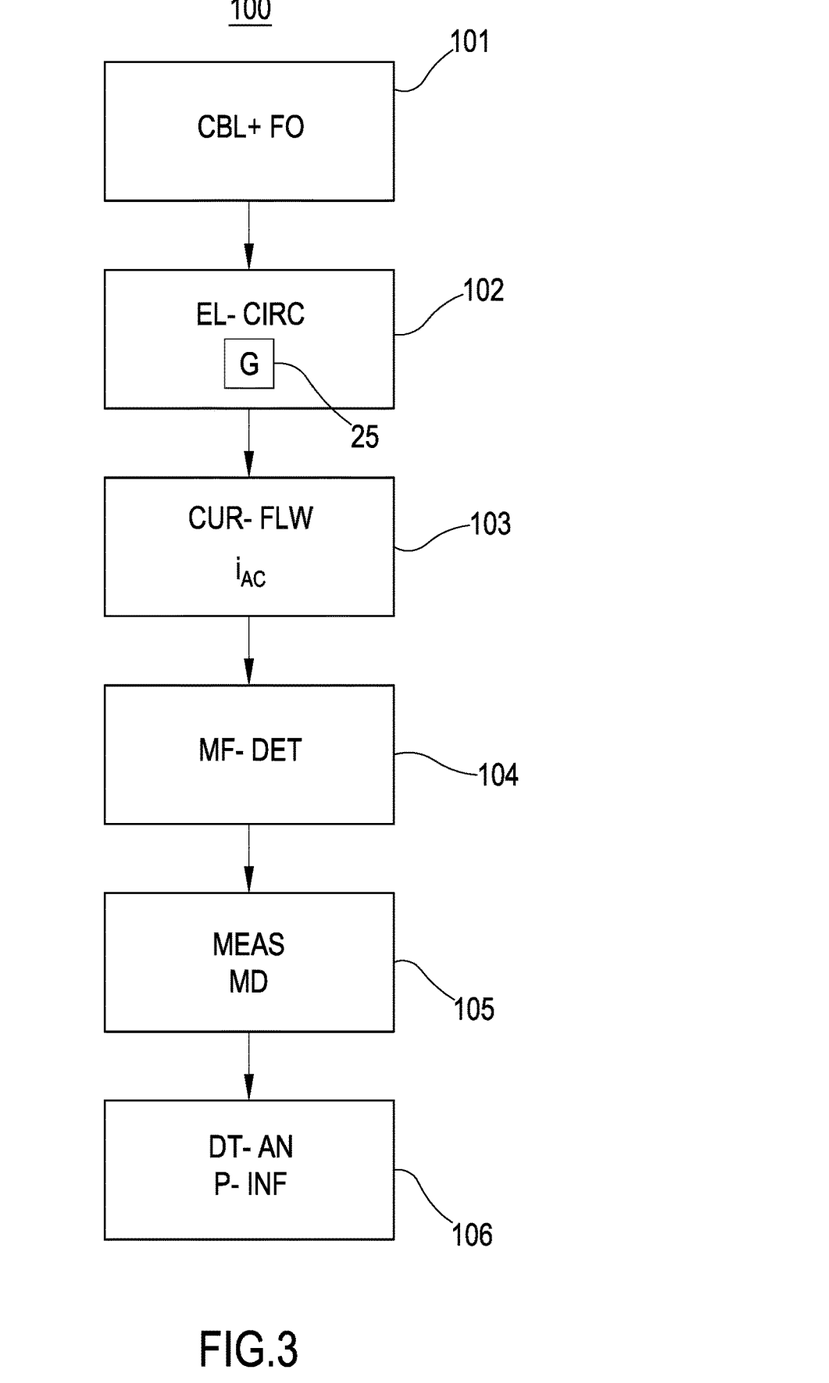
FIG. 3 shows a flow chart of an exemplary analysis method employable to obtain information about at least one structural aspect of an electrical cable.

FIG. 3 shows a flow chart of an exemplary analysis method wo employable to obtain information about at least one structural aspect of an electrical cable 1. Said structural aspect can relate to the position of the optical fiber cable 10 or of the ground conductor 8 in the cable 1 or to parameters associated with the helical stranding/winding in cable 1.

According to a first example, the method 100 can provide information on the position of the optical fiber cable along the electrical cable. The analysis method wo comprises an installation step 101 (CBL-FO) in which an electrical cable analogous to the cable 1 is provided. It is noticed that the analysis method 100 can be also applied to the ground conductor 8 or to cables different from the one described above and including ground conductor/s or optical fiber cables different from the one of FIGS. 1 and 2.

In a connection step 102 (EL-CIRC), an electrical circuit including the metallic tube 12 of the optical fiber cable 10 (or the metallic conductor 8a of the ground conductor 8) and an electrical generator 25 (see also FIG. 4) is formed. In a generation step 103 (CUR-FLW), an electrical current is made to flow along the electrical circuit by the electrical generator 25. Particularly, an alternate current $i_{AC}$ is generated.

In a detection step 104 (MF-DET), a magnetic field external to the cable 1 and associated with the electrical current flowing in the electrical circuit is detected and in a measuring step 105 (MEAS) corresponding measured values MD are obtained.

In analyzing step 106 (DT-AN), the measured values MD are analyzed to obtain information P-INF about, for example, a position assumed by the fiber optic cable 10 or by the ground conductor 8 in the cable 1. It is observed that the magnetic field detected, in this case, outside the cable 1 is correlated to the distance of the metallic tube 12 or of the metallic conductor 8a from the center of the cable 1: this allows deriving information about the position of fiber optic cable 10 or of the ground conductor 8 from the measured values MD.

The analysis method 100 can be implemented during production of a cable (on-line implementation) or on a cable already produced (e.g. during decoiling from one drum).

Figure 4:
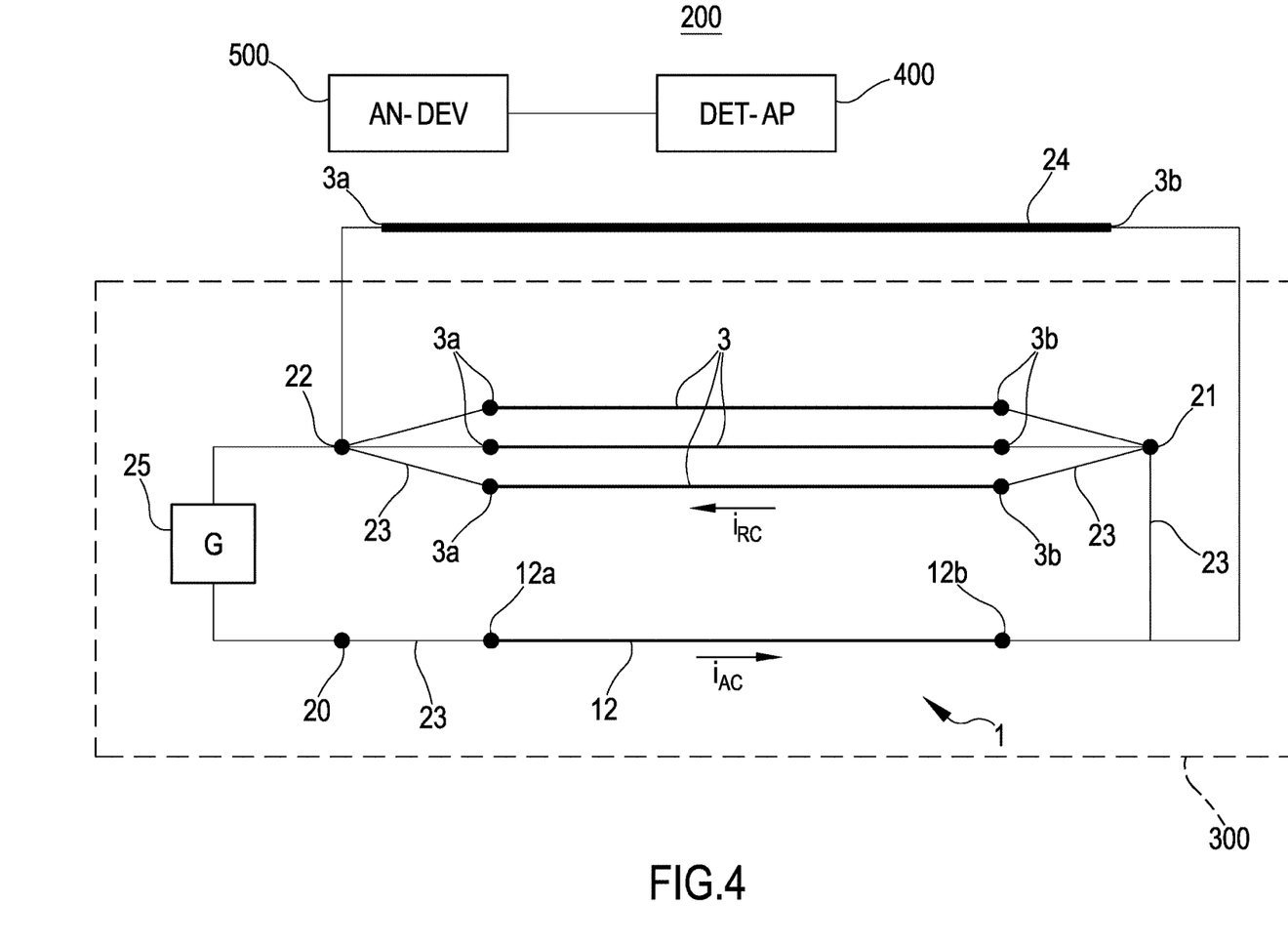
FIG. 4 schematically shows an example of an analysis system that can be employed to perform the analysis method.

FIG. 4 schematically shows an example of an analysis system 200 that can be employed to perform the analysis method 100. The analysis system 200 comprises the electrical generator 25, a magnetic field detection apparatus 400 (DET-AP) and an analysis device 500 (AN-DEV). The electrical generator 25 is connectable to the electrical circuit above described to be part of the electrical circuit itself.

FIG. 4 also shows a particular embodiment 300 of the electrical circuit comprising, in addition to the metallic tube 12 (in this case, but the embodiment could apply as well to the metallic conductor 8a) and the electrical generator 25, the electrical conductors 3 of each cable core 2. It is observed that the representation of FIG. 4 is a circuital schematization showing neither other components of cable 1 (represented in FIGS. 1 and 2) nor the stranded configuration of the fiber optical cable 10 and the cable cores 2.

The metallic tube 12 has a first end 12a and a second end 12b. Each electrical conductor 3 of the cable cores 2 has a first connection end 3a and a second connection end 3b. The first end 12a of the metallic tube 12 is connected to a first terminal 20 of the electrical generator 25, while the second end 12b of the metallic tube 12 is connected to a node 21 which is connected, in turn, to each of the second connection ends 3b of the electrical conductors 3. The first connection ends 3a of the electrical conductors 3 are connected to a second terminal 22 of the electrical generator 25.

The above described electrical circuit 300 can be employed to perform the analysis method 100 considering that the electric cable 1 to be analyzed allows accessing to the ends of the optical fiber cable 10 (or the ground conductor 8) and the cores 2. The connections among the elements of the electrical circuit 300 can be made by means of electrical connectors 23 (e.g. leads), known to the skilled person.

The electrical generator 25 can provide both voltage and current. According to the embodiment of FIG. 3, the current is an alternate current $i_{AC}$ which is injected into the metallic tube 12; the electrical conductors 3 of the cable cores 2 act as return conductors for a returning current $i_{RC}$. As an example, the electrical generator 25 can operate at voltage of 50 V with a frequency of 50 Hz or another frequency value, as an example, comprised between 16 Hz and 400 Hz. Voltage values greater than 50V can be used to increase the detectability of the corresponding magnetic field. In choosing the alternate current $i_{AC}$ to be made flowing within the metallic tube 12 (or the metallic conductor 8a), overheating of the elongated metallic element itself should be avoided; as an example, a current up to 5A avoids the overheating.

In the embodiment of FIG. 4, the three electrical conductors 3 are connected, in the circuit 300, according to an electrical parallel scheme. The magnetic field detectable outside the cable 1 depends on the distance between the metallic tube 12 and the position of the electrical conductors 3, wherein the returning current $i_{RC}$ flows.

As experimentally verified, when the metallic tube 12 is improperly in the center of the cable 1 (position of FIG. 2), the returning current $i_{RC}$ generates a magnetic field that is opposed to that generated by the metallic tube 12 so providing a very low magnetic field resulting value.

On the contrary, the generated magnetic field has greater values when the metallic tube 12 is in position different from the center of the cable 1. Based on those different possible detection situations, the analysis method 100 allows obtaining information on the position of the fiber optic cable 10 (or by the ground conductor 8). It is further noticed that magnetic field outside cable 1 has a peak value in the direction of the elongated metallic element position and a minimum value on the opposite side.

In an embodiment, when the three electrical conductors 3 are employed for the flowing of the returning current, it is suitable to verify that the three currents flowing in the three electrical conductors 3 are not significantly different each other; i.e. the difference between them is lower than 10%.

According to another embodiment, the analysis method 100 can be implemented by forming an electrical circuit 300 in which a single electrical conductor 3 is used for the returning current $i_{RC}$ while the other two electrical conductors 3 are not part of the electrical circuit 300. In this embodiment, the electrical conductor 3 selected to carry the returning current $i_{RC}$ can be the one that is not adjacent to the elongated metallic element (metallic tube 12 or the metallic conductor 8a) when considered in the correct position, i.e. the electrical conductor 3 placed in a radially opposite position with respect to the elongated metallic element. The current flowing through the elongated metallic element and the opposite electrical conductor generates a dipole, and the corresponding magnetic field is proportional to the interaxial distance between the elongated metallic element and the opposite electrical conductor.

In accordance with a further embodiment, the electrical conductors 3 of the three cable cores 2 are not part of the electrical circuit 300 and the returning current $i_{RC}$ is made flowing in another conductor external to the cable 1 (external conductor 24 in FIG. 4) and connected between the second end 12b and the second terminal 22. In this case, the return current $i_{RC}$ does not influence the magnetic field generated in proximity of cable 1. The magnetic field outside cable 1 has a peak value in the direction of the metallic tube 12 and a minimum value on the opposite side. When the metallic tube 12 is in the center of the cable 1, the magnetic field is constant along the circumference of cable 1.

In FIG. 4, the detection apparatus 400 is configured to detect the magnetic field associated to the cable 1 and to the electrical current $i_{AC}$ to provide the measured values MD. The detection apparatus 400 comprises one or more magnetic field probes providing electrical signals (e.g. voltage signals) corresponding to the magnetic field.

While, in an embodiment, the magnetic field probe is an axial magnetic field probe, any magnetic field probe can be connected to a voltmeter (e.g. a multichannel voltmeter) to convert the voltage signals provided by the magnetic field probe into readable values (e.g. digitally represented values) . In accordance with an example, the magnetic field probe can be a sensor MC910 (having a measuring range of 15 Hz to 300 Hz) produced by Magnetic Sciences Inc., Acton, Mass., USA. According to an example, a voltmeter having a resolution of 0.1 mV can be used to read values picked up by a magnetic field probe providing a magnetic field resolution of 0.01 milliGauss (mG).

The analyzing device 500, which is connected to the detection apparatus 400, is configured to process the measured values MD provided by the detection apparatus 400 to obtain information about a position assumed by, e.g., the integrated fiber optic cable 10 within the three-phase electrical cable 1. The analyzing device 500 can include a Control and Processing Unit (CPU) and is provided with a memory module (not shown) to store digital values provided by the detection apparatus 400. The analyzing device 500 can store software instructions for the processing of the measured data MD to provide information about a position assumed by the integrated optical fiber cable 10. As an example, the analyzing device 500 is implemented by means of a microcontroller.

Further particular aspects of the analysis method 100 are described in the following, with reference to the analysis system 200, considering the electrical circuit 300 described with reference to FIG. 4.

In the installation step 101, cable 1, having a length L, is placed in a substantially rectilinear position. As an example, cable 1 is made laying on a plurality of supports regularly spaced.

In the detection step 104, the detection apparatus 400 is used to scan the magnetic field and reading a plurality of values thereof. Each resulting value is stored in the memory of the analysis device 500 for processing. In the case of flowing alternate current, the resulting values are expressed by the corresponding absolute values (i.e. by a modulus) of the magnetic field detected with the employed probe. In the case of flowing direct current, the measured values are expressed as + or − values. A plurality of magnetic field readings can be carried out at different longitudinal positions along cable 1. As an example, the longitudinal positions at which values are read can be spaced each other of 25 cm. In an embodiment, at each longitudinal position a group of readings can be performed at different angles $AG_i$ along a reference circumference surrounding cable 1 and laying in substantially the same cross section of the cable under investigation. As an example, twelve readings, spaced each other of an angle of 30°, can be performed at each longitudinal position.

Each magnetic field reading is carried out maintaining the magnetic field probe of the detection apparatus 400 at substantially a fixed distance from the external surface of the cable 1. As an example, if a magnetic field axial probe is used, it should be considered that this probe (having a cylindrical shape) measures mainly the component of the magnetic field parallel to the axis of the cylinder, accordingly the magnetic field axial probe should be placed tangent to the outer surface of cable 1.

Among the group of readings (i.e. data values) EMFij performed at each longitudinal position j at different angles $AG_i$, only the maximum value in module (i.e. a peak value PKj), together with the corresponding angle value AGj, evaluated along the circumference of cable 1, should be selected by the analysis apparatus 500. The reading and the selection of a peak value PKj is repeated for the plurality of longitudinal positions lj along the cable 1 so obtaining a plurality of peak values PKj, where each value is associated to a longitudinal position lj and a corresponding angle value AGj.

The analysis apparatus 500 analyzes the plurality of peak values PKj and/or the corresponding angle values AGj, associated with the longitudinal positions lj, and recognizes irregularities in the position assumed by the elongated metallic element (the metallic tube 12, in this case).

The analysis apparatus 500 can be configured to plot a first curve representing the plurality of peak values PKj versus the corresponding longitudinal positions lj and/or a second curve representing the plurality of angle values AGj, associated to the peak values PKj versus the corresponding longitudinal positions lj.

As experimentally noticed by the Applicant, if the elongated metallic element has a correct position along the whole length of electrical cable, the first curve and the second curve have a substantially regular behavior and/or they do not show sudden changes in their trends. On the contrary, if the elongated metallic element has an improper position in at least one portion of the electrical cable, both the first curve and the second curve show irregularities (such as, sudden changes in their trends).

Figure 5:
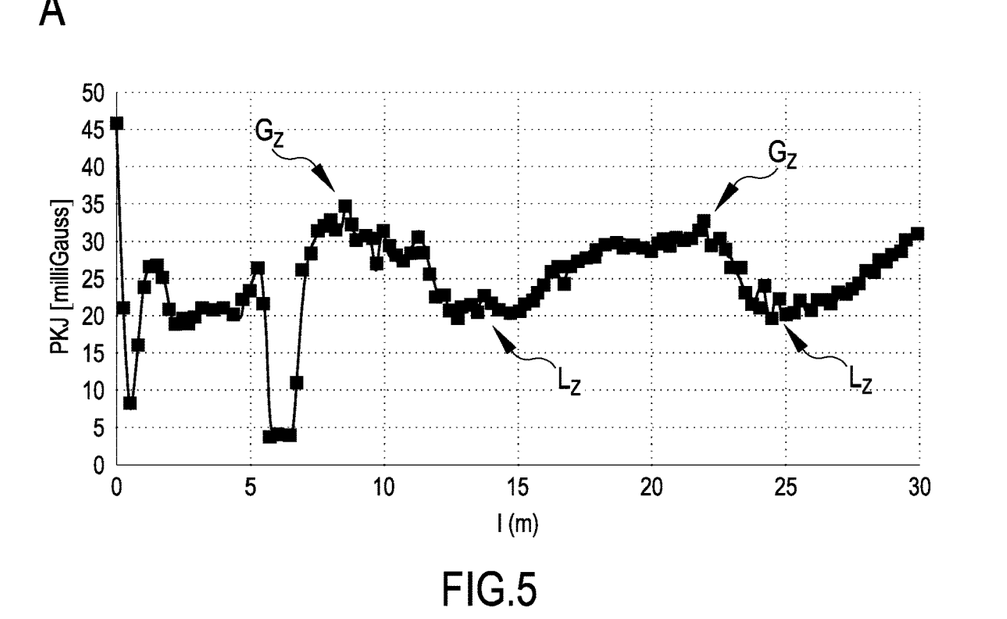
FIG. 5 illustrates a first curve obtained from measures of peak values of a magnetic field along the cable length.

FIG. 5 illustrates an example of the first curve A obtained from measures performed on a real cable, analogous to cable 1 and using all the three electrical conductors of the cable cores as return conductors. In FIG. 5, the peak values PKj (in mG) of the tangential magnetic field are plotted versus the corresponding longitudinal positions lj (in meters). While the first 1.5 m length should not be considered due to the presence of noise given by the electrical generator, the peak values are generally comprised between 20 and 35 mG, with a clear irregularity (a peak value drop down to about 4 mG) for about 1 m length between the longitudinal position from 5.0 m to 7.5 m.

Figure 6:
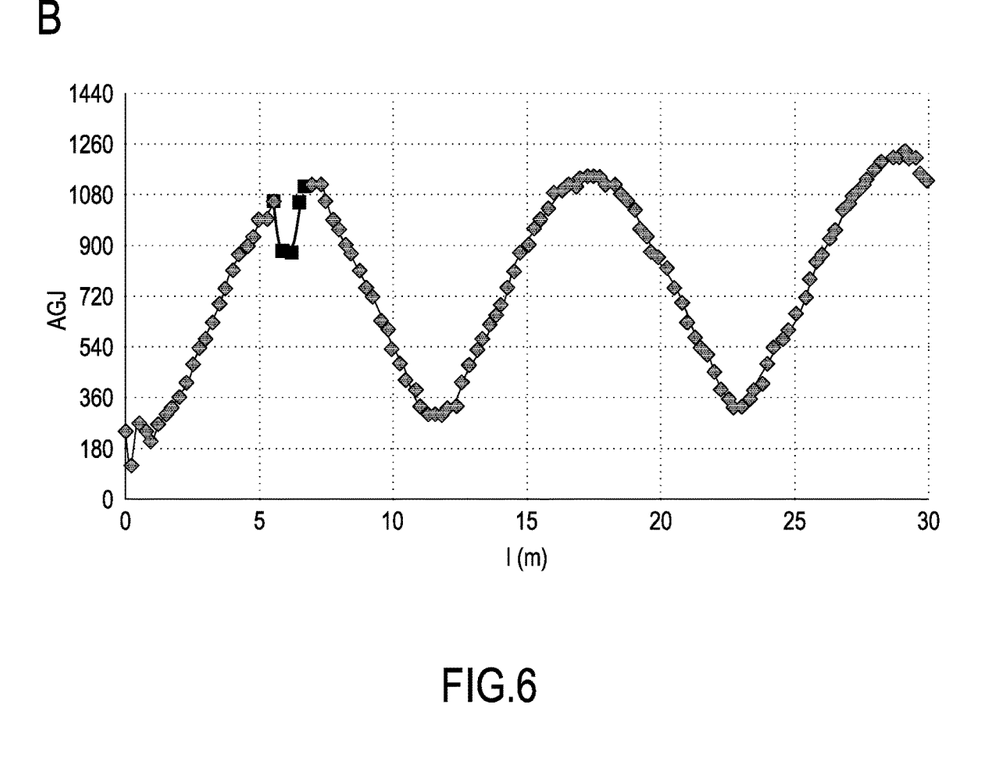
FIG. 6 illustrates a second curve representing angle values, valuated around the electrical cable, associated with the peak values along the cable length.

FIG. 6 illustrates an example of the second curve B obtained from measures performed on the same cable considered for FIG. 5. In FIG. 6, the angle values AGj (associated to the peak values PKj) are plotted versus the corresponding longitudinal positions lj (in meters). In FIG. 6, the angle values AGj are expressed in degrees and according to an unwrap function (adding or subtracting 360°, when the value overpasses such angle) which allows correcting phase angles to produce smoother phase plots. In general, an unwrap function corrects the angle degrees in a vector P by adding multiples of ±360° when absolute jumps between consecutive elements of P are greater than or equal to the default jump tolerance of 360°.

The irregularity is recognizable also in FIG. 6: the values of the angular positions show a sudden change of 180 degrees, between the longitudinal positions 5.0 m a 7.5 m.

The above-mentioned irregularity can be recognized by a visual analysis of the first and/or second curves A and B or by a specifically configured software running in the analysis device 500. As above indicated, the first and second curves also allow locating the portion of the cable 1 in which the optical fiber cable 10 has assumed the improper position. Both the first and second curves A and B show the irregularity in the same longitudinal position length.

The first and second curves A and B of FIGS. 5 and 6 have been obtained from measurements performed on a portion of a three-core armored cable (3×240 mm$^2$) having a length of 30 m. The currents measured in the three cores 2 ware: red phase: 1.51 A, yellow phase: 1.48, blue phase: 1.03 A. The sum of the three currents is 4.02 A. The current measured in the metallic tube 12 was 3.90 A, being suitably similar to the sum of the currents in the three core conductors.

According to the experiments made by the Applicant, the presence of the armoring 23 in the tested electric cable 1 shields less than 50% of the generated magnetic field and does not modify the shape of the field.

It is possible that the analysis method 100 is carried out in the presence of magnetic background noise. To minimize the disturbance from the magnetic background noise onto the magnetic field measures, the analysis system 200 and cable 1 can be positioned in a copper or steel shielding pipe. Alternatively, a particular frequency of the injected alternate current $i_{AC}$ (e.g. different from 50 Hz) can be selected to filter part of the environmental noise. In accordance with a further approach, the electrical generator 15 (e.g. a voltage generator) can be selected to cause the current flowing in the metallic tube having intensity sufficient to generate a magnetic field which is not affected by the environmental noise.

When the electrical cable 1 contains two optical fiber cables 10 in separated positions, the analysis system 200 can check if both optical fiber cables 10 are in their proper positions. According to a possible implementation, the analysis system 200 is configured to inject one alternate current into each of the two metallic tubes 12 at different frequencies. In this implementation, an additional electrical generator can be used to operate at an additional frequency. In accordance with a first example, the magnetic field values at two different positions, shifted circumferentially (e.g. by 60 degrees) or longitudinally by some cable diameters, are measured. According to another example, the measure of the magnetic field values at the two frequencies is performed by the same probes at the same positions, and the corresponding electrical signals superposed by the probes are then separated with a filter according to the two employed frequencies. For example, one frequency can be selected below 50 Hz and the other above 50 Hz. As an example, the signal separation can be implemented inside a wattmeter or an oscilloscope.

Figure 7:
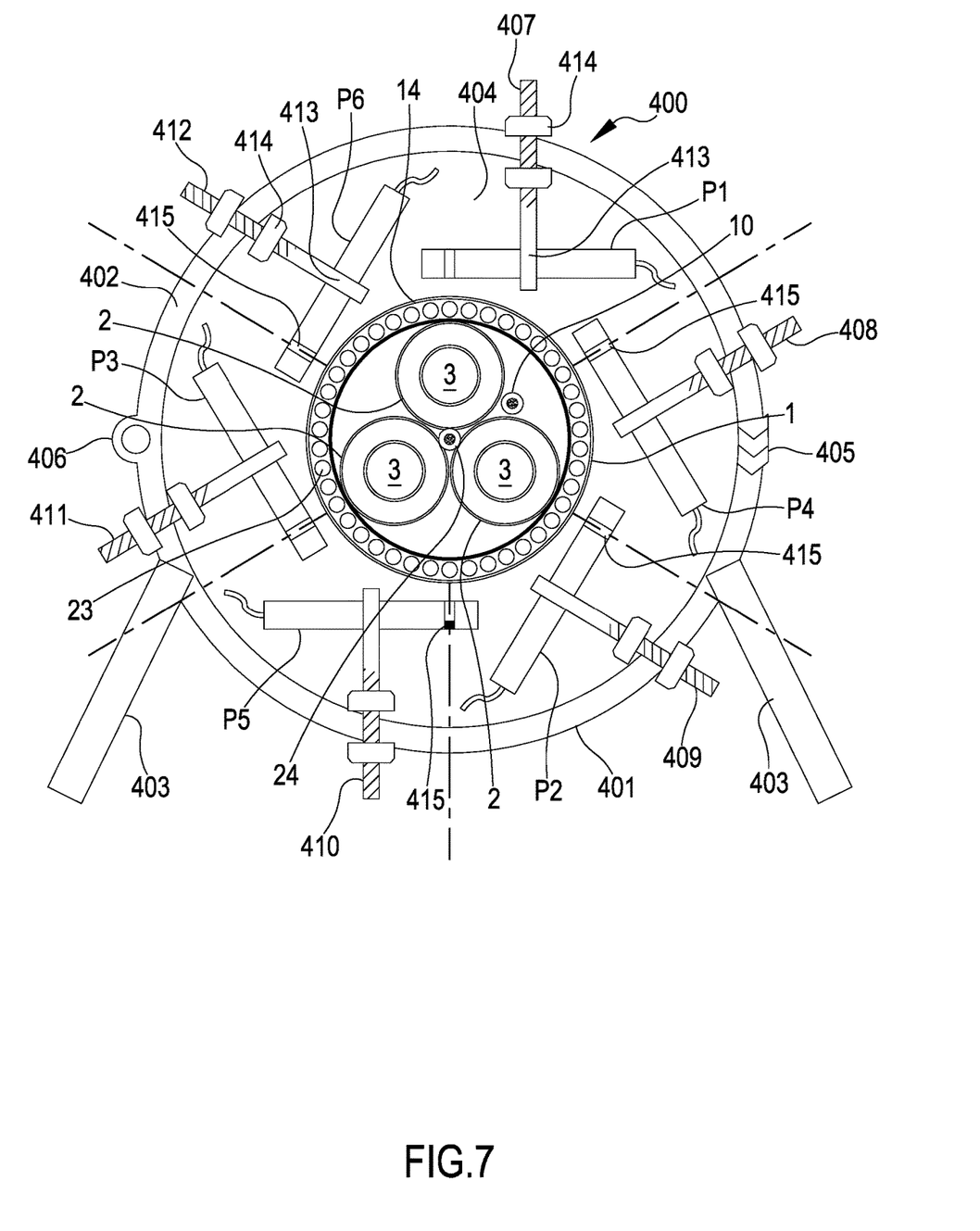
FIG. 7 shows an example of a detection apparatus employable in the analysis method.

FIG. 7 shows an example of the detection apparatus 400 employable in the analysis method 100 for analyzing a cable 1 including a single optical fiber cable 10 or also at least one additional optical fiber cable 24 (exemplary illustrated in an improper position).

The detection apparatus 400, as shown in FIG. 7, comprises a support structure 401 configured to support a plurality of magnetic field probes P1-P6 (as an example, six probes are shown). According to the example shown, the support structure 401 comprises a support frame 402 having, for example, a ring shape, and provided with at least one support element 403 (e.g. a tripod) to allow a vertical regulation of the distance of support frame 402 from the ground. The support structure 401 is made of non-metallic material to avoid interaction with the magnetic field to be measured.

The support frame 402 defines an internal hollow region 404 where the cable 1 can be inserted for performing the measurements. In order to open and close the support frame 402 for introduction of the cable 1, an opening/closure 405 and a hinge 406 are also provided in the support frame 402.

The support structure 401 further includes a plurality of fixing devices 407-412 configured to arrange the magnetic field probes P1-P6 to the support frame 402 in a suitable position, preventing the rotation of the probes. The fixing devices 407-412 can be in the form of rods each having a clamp 413 (e.g. a ring with a screw) to hold a corresponding magnetic field probe P1-P6. The fixing devices 407-412 can be made, as an example, by plastic screws passing through holes made in the support frame 402 and blocked with bolts 414.

The magnetic field probes P1-P6 can be uniaxial probes, for example the above-mentioned probes produced by Magnetic Science Inc. Each magnetic field probe P1-P6 comprises a sensing tip 415. The support structure 401 is configured to maintain the magnetic field probes P1-P6 in a plane orthogonal to the longitudinal axis Z of the cable 1 and tangent to the external surface of the cable 1 to measure the tangential component of the magnetic field. The fixing devices 407-412 are placed in such a way that the magnetic field probes P1-P6 are spaced each other of the same angle, as an example, of 60°.

Considering a particular situation in which, as shown in FIG. 7, cable 1 comprises two optical fiber cables (optical fiber cable 10 and the additional optical fiber cable 24), a first subgroup of equidistant magnetic field probes can be used to detect the magnetic field associated with the optical fiber cable 10, and a second subgroup of equidistant magnetic field probes can be used to detect the magnetic field associated with the additional optical fiber cable 24. As described above, in the metallic tube 12 of the optical fiber cable 10 is injected an alternate current $i_{AC}$ at a first frequency (e.g. 28 Hz) while in the metallic tube 12 of the additional optical fiber cable 24 is injected an alternate current at a second frequency (e.g. 85 Hz).

As an example, the three magnetic field probes P1, P3, P5 (angularly spaced of 120°) can be used to detect the magnetic field associated with the optical fiber cable 10 and the three magnetic field probes P2, P4, P6 (angularly spaced of 120°) can be used to detect the magnetic field associated with the additional optical fiber cable 24.

According to an alternative embodiment, the magnetic field probes P1-P6 can be mounted on an arm that can rotate to modify the distance from the surface of the cable 1. If the arm is blocked, each probe P1-P6 has a fixed distance from the cable 1. If the arm is free to rotate, a spring can press gently the probe on the cable 1, to keep the probe at a constant distance from the cable surface.

In an embodiment, the electrical cable to be checked can be laid on non-metallic supports, regularly spaced on the ground.

The analysis method 100 can be employed to obtain information on parameters associated with the helical stranding/winding performed in manufacturing cable 1. Such parameters can include the core stranding pitch of cable 1. The obtainable parameters can also include: the cable pitch, the cable twisting, longitudinal positions of inversion zones and/or longitudinal position of contralay/equilay zones, as explained in the following.

Figure 8:
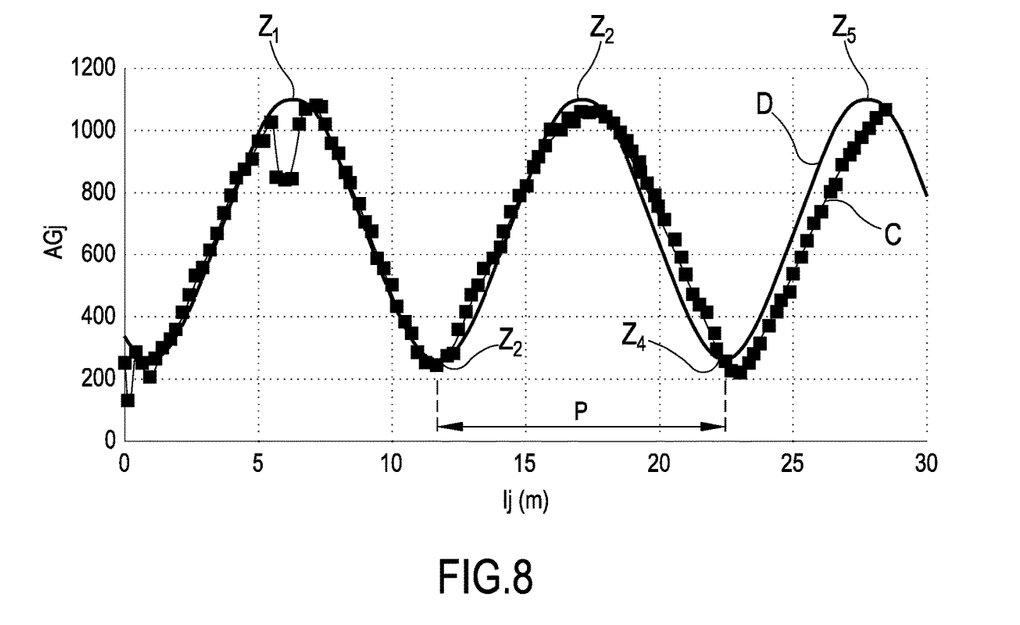
FIG. 8 shows a third curve representing angle values associated with peak values of magnetic field, following a fitting of the data of FIG. 6.

FIG. 8 refers to an SZ cable (i.e. an electrical cable having the cable core wound according to an SZ-lay) and shows a third curve C, obtained analogously to the second curve B of FIG. 6: angle values AGj (associated to the peak values PKj) are plotted versus the corresponding longitudinal positions lj. Moreover, FIG. 8 shows a sinusoidal pattern D fitting the third curve C. The third curve C and/or the sinusoidal pattern D allow determining longitudinal positions of inversion zones Zi, corresponding to the points where the curves change from an increasing trend to a decreasing trend and viceversa. When the electrical cable under investigation comprises elements with a single winding direction (clockwise or counterclockwise) for the whole cable length, a graph like that of FIG. 8 will show a substantially rectilinear line in the absence of cable structural defects which, if present, cause irregularities in the rectilinear path.

Moreover, the curves of FIG. 8 allow determining the period of the SZ cable, as the distance between two inversion zones Zi of the same type. According to the example of FIG. 8, the period P is 11.4 m.

Figure 9:
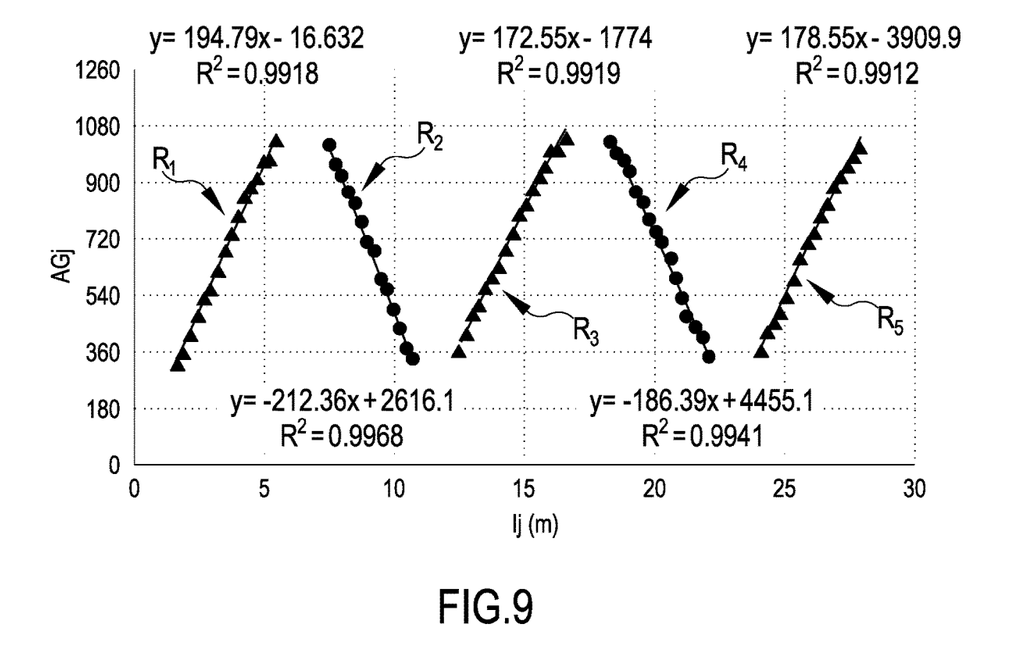
FIG. 9 shows linear portions extracted of the curve of FIG. 8.

FIG. 9 shows linear portions R1-R5 extracted from the curves of FIG. 8, each corresponding to a cable portion containing cable cores helically stranded according to the same rotation direction. FIG. 9 also shows the equations mathematically describing said linear portions R1-R5. Analyzing the linear portions R1-R5 is possible to determine the corresponding cable twisting (expressed in degrees/m) and the rotation pitch, as indicated in the Table below. The cable twisting corresponds to the slope of the specific linear portion R1-R5 and represents the amount of rotation degrees made along 1 meter of length during the manufacturing. The cable twisting can be divided for 360 to obtain the cable rotation, expressed in revolutions/m, as indicated in the Table. Moreover, by computing the inverse of the cable rotation, the core stranding pitch can be obtained for every cable portions of curves R1-R5, as shown in the Table.

TABLE

| Parameter | Core stranding [degrees/m] | Cable rotation [degree/m] | Core stranding pitch [m] |
|---|---|---|---|
| First rotation ($R_1$) | 194.79 | 0.541 | 1.85 |
| Second rotation ($R_2$) | −212.36 | −0590 | −1.69 |
| Third rotation ($R_3$) | 172.55 | 0.479 | 2.9 |
| Fourth rotation ($R_4$) | −186.39 | −0.518 | −1.93 |
| Fifth rotation ($R_5$) | 178.55 | 0.496 | 2.02 |

In the case of an armored electric cable like cable 1 of FIGS. 1 and 2, the present analysis method and apparatus can be used to get information about the unilay and contralay zone.

In the present description and claims, the term "unilay" is used to indicate that the stranding of the cable cores and the winding of the metal wires of an armor layer have a same direction (for example, both left-handed or both right-handed), with a same or different pitch in absolute value.

In the present description and claims, the term "contralay" is used to indicate that the stranding of the cores and the winding of the metal wires of an armor layer have an opposite direction (for example, one left-handed and the other one right-handed), with a same or different pitch in absolute value.

Information about the unilay and contralay zones, which can be important both for quality assessment and for evaluating the armor losses of a cable with an SZ lay of the core (as described, for example, in WO2018/192666) can be inferred from the curve A (FIG. 5) representing the plurality of peak values PKj versus the corresponding longitudinal positions lj. Zones Lz, where the magnetic field has lower values, correspond to contralay portions of cable 1; while, unilay portions of cable 1 can be associated to zones Gz of curve A, where magnetic field has greater values.

As described above, analysis method 100 and analysis system 200 allow determining if the position of the elongated metallic element (of the optical fiber cable 10 or of the ground conductor 8 within the electrical cable 1 is correct or if there are anomalies by performing measures external to the cable itself, also in presence of a metal armoring.

Moreover, analysis method 100 and analysis system 200 allow verifying if some structural aspects of the considered electrical cable meet the corresponding design or anomalies have been occurred in the manufacturing process or in deploying procedures.

What is claimed is:

1. An electrical cable analysis method, comprising:
   providing an electrical cable comprising an elongated metallic element and two or more cable cores, the cores helically stranded around a cable longitudinal axis, each of the cable cores comprising an electrical conductor, the elongated metallic element comprising a metallic tube comprised in an optical fiber cable or a metallic conductor of a ground conductor;
   connecting an electrical generator to an electrical circuit including the elongated metallic element;
   generating, by the electrical generator, a flow of an electrical current along the electrical circuit;
   detecting a magnetic field outside the electrical cable due to the flow of the electrical current in the electrical cable;
   measuring at least one value relating to the magnetic field along a cable length of the electrical cable; and
   analyzing the measured at least one value to obtain information about at least one structural aspect of the electrical cable, the structural aspect comprising a position assumed by the elongated metallic element inside the electrical cable.

2. The method of claim 1, wherein the elongated metallic element is stranded with the cable core around cable longitudinal axis.

3. The method of claim 1, wherein the elongated metallic element is rectilinearly positioned along or near cable longitudinal axis.

4. The method of claim 1, further comprising selecting at least one electrical conductor having a first connection end and a second connection end, the at least one electrical conductor being selected from the electrical conductor of the cable cores, another electrical conductor of the electrical cable, or an external conductor external to the cable;
   wherein the elongated metallic element has a first end and a second end; and
   wherein connecting the electrical circuit to the electrical generator comprises:
      connecting the second end of the elongated metallic element to the second connection end of the electrical conductor; and
      connecting the first end of the elongated metallic element to a first terminal of the electrical generator and the first connection end of the electrical conductor to a second terminal of the electrical generator.

5. The method of claim 4, wherein the at least one electrical conductor is selected from an electrical conductor of the electrical cable or an electrical conductor external to the electric cable.

6. The method of claim 1, wherein the electrical current comprises an alternate current (AC) or a direct current (DC).

7. The method of claim 1, wherein the magnetic field comprises a tangential magnetic field.

8. The method of claim 1, wherein detecting the magnetic field comprises providing one or more magnetic field probes configured to provide electrical signals corresponding to the magnetic field.

9. The method of claim 1, the measuring comprises reading a plurality of values relating to the magnetic field along the cable length.

10. The method of claim 1, wherein the analyzing comprises at least one of the following steps:
   analyzing a peak value of the magnetic field associated to the electrical cable; and
   analyzing angular positions of the peak value with respect to a circumference surrounding the electrical cable.

11. The method of claim 1, wherein the measuring comprises:
   measuring a first plurality of magnetic field values each associated with a respective first angular peak position on a first reference circumference surrounding the electrical cable, the first reference circumference being positioned at a first longitudinal position along the electrical cable;
   selecting among the first plurality of magnetic field values a first peak value and the corresponding first angular peak position;
   measuring at least one further plurality of magnetic field values each associated with at least one respective further angular position on at least one further reference circumference surrounding the electrical cable; the at least one further reference circumference being positioned at least one further longitudinal position along the electrical cable; and
   selecting, among the at least one further plurality of magnetic field values, at least one further peak value and at least one respective further angular peak position.

12. The method of claim 11, wherein the analyzing comprises analyzing at least one of the following trends to obtain information about at least one structural aspect of the electrical cable:
   a first trend related to the first peak value associated with the first longitudinal position and the at least one further peak value associated with the at least one further longitudinal position; and
   a further trend related to the first angular peak position associated with the first longitudinal position and the at least one further angular peak position associated with the at least one further longitudinal position.

13. An electrical cable analysis system comprising:
   an electrical generator connectable to an electrical circuit including an elongated metallic element integrated into an electrical cable comprising two or more cable cores helically stranded around a cable longitudinal axis and each of the cable cores comprising an electrical conductor, the elongated metallic element comprising a metallic tube comprised in an optical fiber cable or a metallic conductor of a ground conductor; the electrical generator being configured to generate an electrical current flowing into the elongated metallic element;
   a detection apparatus configured to detect a magnetic field outside the electrical cable due to the electrical cable from the generated electrical current to provide at least one measured value; and
   an analyzing device configured to process the at least one measured value to obtain information about at least one structural aspect of the electrical cable, the structural aspect comprising a position assumed by the elongated metallic element inside the electrical cable.

14. The system of claim 13, wherein the at least one structural aspect of the electrical cable further comprises a stranding/winding parameter associated to the electrical cable.

15. The system of claim 13, wherein the detection apparatus comprises one or more magnetic field probes configured to provide electrical signals corresponding to the magnetic field.

* * * * *